US012586640B2

(12) United States Patent
    Brown et al.

(10) Patent No.: US 12,586,640 B2
(45) Date of Patent: *Mar. 24, 2026

(54) ACCESS COMMAND DELAY USING COMMAND DELAY CIRCUITRY

(71) Applicant: Lodestar Licensing Group, LLC, Evanston, IL (US)

(72) Inventors: Jason M. Brown, Allen, TX (US); Vijayakrishna J. Vankayala, Allen, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/658,559

(22) Filed: May 8, 2024

(65) Prior Publication Data
    US 2024/0290384 A1     Aug. 29, 2024

Related U.S. Application Data

(63) Continuation of application No. 17/853,563, filed on Jun. 29, 2022, now Pat. No. 11,996,149, which is a continuation of application No. 17/013,234, filed on Sep. 4, 2020, now Pat. No. 11,380,395.

(51) Int. Cl.
    *G11C 13/00* (2006.01)
    *H03L 7/081* (2006.01)
(52) U.S. Cl.
    CPC ........ *G11C 13/0061* (2013.01); *G11C 13/003* (2013.01); *H03L 7/0816* (2013.01)
(58) Field of Classification Search
    CPC ... G11C 13/0061; G11C 13/003; G11C 7/222; G11C 29/023; G11C 29/028; G11C 29/50012; G11C 13/004; G11C 13/0069; G11C 7/22; H03L 7/0816; H03L 7/0805; H03L 7/08

USPC .......................................................... 365/148
    See application file for complete search history.

(56) References Cited

U.S. PATENT DOCUMENTS

| | | | |
|---|---|---|---|
| 9,407,273 B1 | 8/2016 | Wei et al. | |
| 9,455,726 B1 | 9/2016 | Wei et al. | |
| 9,614,533 B2 | 4/2017 | Wei et al. | |
| 10,270,453 B2 | 4/2019 | Wei et al. | |
| 10,381,055 B2 | 8/2019 | Qawami et al. | |
| 10,454,484 B1 | 10/2019 | Shi et al. | |
| 10,923,177 B1 * | 2/2021 | Chang | G11C 11/4076 |

(Continued)

FOREIGN PATENT DOCUMENTS

| | | |
|---|---|---|
| CN | 101276642 A | 10/2008 |
| CN | 103516335 A | 1/2014 |

OTHER PUBLICATIONS

Office Action for CN Application No. 202111004115.4 mailed Jul. 11, 2025 with English translation, 16 pages.

*Primary Examiner* — Fernando Hidalgo
(74) *Attorney, Agent, or Firm* — Fletcher Yoder, P.C.

(57) ABSTRACT

Memory devices may have a memory array and a command delay circuit that adjusts signals associated with operations to access of the memory array. The memory device may also include a controller that delays an access command to access the memory array by transmitting the access command through delay circuitry of the command delay circuitry. This may cause the access command to be delayed by a first duration of time when output from the delay circuitry. Delay of the access command may align a data signal and the access command such that the access command and a system clock may cause latching of suitable data of the data signal.

20 Claims, 4 Drawing Sheets

(56)                    References Cited

U.S. PATENT DOCUMENTS

| | | | | |
|---|---|---|---|---|
| 11,380,395 | B2 * | 7/2022 | Brown | H03L 7/0805 |
| 11,545,219 | B2 | 1/2023 | Bedeschi et al. | |
| 11,996,149 | B2 * | 5/2024 | Brown | H03L 7/0816 |
| 2008/0062809 | A1 | 3/2008 | Lee et al. | |
| 2008/0075222 | A1 | 3/2008 | Lee et al. | |
| 2012/0106275 | A1 * | 5/2012 | Ok | G11C 7/1093 |
| | | | | 365/233.18 |
| 2012/0311372 | A1 | 12/2012 | Iijima | |
| 2013/0214833 | A1 | 8/2013 | Kim | |
| 2013/0278917 | A1 | 10/2013 | Korekado et al. | |
| 2016/0056806 | A1 * | 2/2016 | Rapinoja | H03K 5/159 |
| | | | | 327/158 |
| 2017/0309323 | A1 * | 10/2017 | Ishibashi | G11C 7/222 |
| 2020/0203361 | A1 | 6/2020 | Kang et al. | |
| 2021/0006254 | A1 | 1/2021 | Kim et al. | |
| 2021/0075429 | A1 | 3/2021 | Han et al. | |
| 2021/0143807 | A1 | 5/2021 | Kim et al. | |
| 2021/0335403 | A1 | 10/2021 | Choi et al. | |

* cited by examiner

ACCESS COMMAND DELAY USING COMMAND DELAY CIRCUITRY

CROSS-REFERENCE TO RELATED APPLICATION

This application is a continuation of U.S. Non-Provisional application Ser. No. 17/853,563 entitled "ACCESS COMMAND DELAY USING DELAY LOCKED LOOP (DLL) CIRCUITRY," filed Jun. 29, 2022, which is a continuation of U.S. Non-Provisional application Ser. No. 17/013,234 entitled "ACCESS COMMAND DELAY USING DELAY LOCKED LOOP (DLL) CIRCUITRY," filed Sep. 4, 2020, all of which are incorporated herein by reference in their entireties.

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a word line or a bit line. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of a threshold-type memory cell may be a cross-point memory cell.

With threshold-type memories, word lines and bit lines are used to transmit selection signals to respective memory cells. The selection signals may include signals characterized by voltage levels used to save data into or retrieve data from the memory cells. The word lines and bit lines may couple to selection signal sources through drivers. The memory cells may be organized into one or more layers of memory cells, such as layers defined between overlapping word lines and bit lines. These layers may be referred to as decks (e.g., memory decks). Various combinations of the word lines, bit lines, and/or decoders may be referenced for use in a particular memory operation using addresses (e.g., memory addresses). The address may indicate which memory cell is to be selected using a combination of signals from the word lines, bit lines, and/or decoders, and a particular value of the address may be based on ranges of addresses of the memory device.

Memory cells are accessed by a controller to obtain stored voltages interpretable as data. Access operations may include read operations and write operations. When accessing memory, different clock domains may be used, for example, a clock domain (e.g., global or system clocking domain) and a data strobe or data clock (DQS) domain. Sometimes signals are exchanged between the different clock domain, and sometimes the exchanged signals are to be retimed between the different clock domains. For example, data being input to a memory cell may be timed to the DQS domain. A write command used to request the writing of the data in the memory cell may be timed to a clock domain, and thus clocked and/or latched using the clock domain. However, being timed according to the clock domain may lead to timing differences relative to the DQS domain.

BRIEF DESCRIPTION OF THE DRAWINGS

Various aspects of this disclosure may better be understood upon reading the following detailed description and upon reference to the drawings in which:

FIG. 3 is a timing diagram illustrating a comparison of timing of a system clock (CLK) signal, a first possible timing of a data clock (DQS) signal, a second possible timing of a data clock (DQS) signal, and timing of an access command desired to be aligned with a rising edge of the CLK signal and have a particular amount of overlap with the DQS signal, according to an embodiment of the present disclosure.

DETAILED DESCRIPTION

Figure 1:
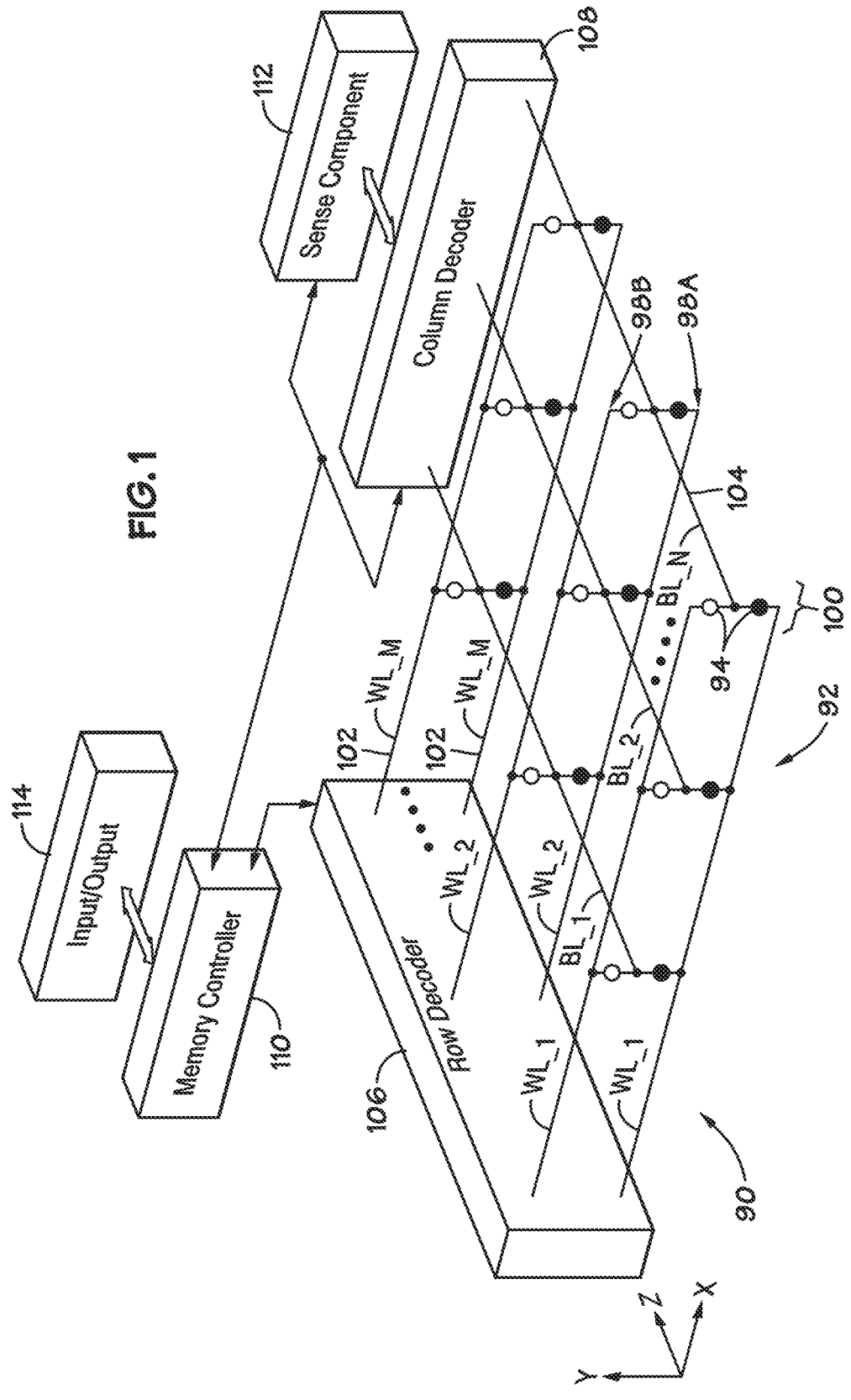
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bit line and a word line. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell. Access commands (e.g., read commands, write commands) may be used to generate the selection signals, such as by instructing which of the memory cells to read and/or write.

When reading or writing data to a memory cell, data may cross time domains (e.g., between a storage time domain and a device time domain). Indeed, the memory cell may operate according to data strobe or data clock signals (DQS signals) and a device may operate according to a system clock signal (e.g., clock signal). When writing to and/or reading data from the memory cell, the data may be clocked according to the time domain it is entering into as a way of converting the timing of the data into the desired time domain. For example, when writing data to the memory cell, it may be desired to align a phase of the data to be stored and the corresponding write command with a phase of data leaving the memory cell.

Alignment of clocking transitions between the time domains may enable information of the access command to be latched for further use and/or transmission. Indeed, when these signals are generally aligned, a clock arriving at a clock input may overlap with corresponding data arriving at a data input, where the data arriving at the data input may be latched by a data clock arriving at a data clock input. Arrival times of each signal to each of the clock input and data clock input may be determined and used to determine an amount by which to offset the timing of the signals to improve alignment. However, these inputs may be disposed relatively apart from each other on an integrated circuit. Indeed, a control system may be unable to adjust timing differences between the data clock and the clock for use to adjust a current access command when receiving information regarding the timing differences associated with the current access command (e.g., adjustments may be delayed one or more clocking cycles). Although adjusting for a timing difference may be unable to be performed at the clock pads and/or in response to signals received at the clock pads, a delay locked loop (DLL) may be used to compensate for the timing differences.

To elaborate, DLL circuitry may operate to align clocking signals with data transmitted throughout a device. To improve timing alignment of a command when transmitted between a storage time domain and a device time domain, the DLL circuitry may also be used to transmit access command signals (e.g., read command signals, write command signals) such that the access command undergoes the same process delays that the storage time domain and/or device time domain signals undergo, permitting easier alignment with the other of the time domains. Indeed, the DLL may align internal signals to a device time domain prior to the internal signals transmitting into the device from external circuitry (e.g., circuitry outside of a core of a device, signals from memory). By sending the access command signals through DLL circuitry (e.g., a similar DLL circuit that transmits in parallel to another DLL circuit, a same DLL circuit, at least partially shared DLL circuits), the access command signals are latched with a same clock used to clock data, where both are altered by the same or substantially similar delays (e.g., delays from changes in voltage and/or temperatures). It is noted that this disclosure discusses systems and methods in reference to three-dimension cross point memory and/or threshold memory since, for example, these types of memory may experience the particular timing differences described herein. However, memory of different types may benefit from implementation of the systems and methods to perform timing alignment operation between signals and DQS clock signals.

Keeping the foregoing introduction in mind, FIG. 1 is a block diagram of a portion of a memory device 90. Memory device 90 may also be referred to as an electronic memory apparatus. FIG. 1 is an illustrative representation of various components and features of the memory device 90. As such, it should be appreciated that the components and features of the memory device 90 are shown to illustrate functional interrelationships, not their actual physical positions within the memory device 90. In the illustrative example of FIG. 1, the memory device 90 includes a three-dimensional (3D) memory array 92. The 3D memory array 92 includes memory cells 94 that may be programmable to store different states. In some examples, each memory cell 94 may be programmable to store two states (e.g., voltage having a voltage level indicative of or interpretable as a value), denoted as a logic 0 and a logic 1. In some examples, a memory cell 94 may be configured to store more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 92 may include two or more two-dimensional (2D) memory decks 98 formed on top of one another (e.g., deck 98B is disposed on deck 98A). This may increase a number of memory cells that may be placed or created on a single die or substrate as compared with 2D arrays (e.g., increase a density of memory cells 94), which in turn may reduce production costs, or increase the performance of the memory device, or both. The memory array 92 may include two levels of memory cells 94 and may thus be considered a 3D memory array; however, the number of levels is not limited to two. Each level may be aligned or positioned so that memory cells 94 may be aligned (exactly, overlapping, or approximately) with one another across each level, forming a memory cell stack 100. In some cases, the memory cell stack 100 may include multiple memory cells 94 laid on top of another while sharing an access line for both as explained below. In some cases, the memory cells 94 may be multi-level memory cells configured to store more than one bit of data using multi-level storage techniques.

In some examples, each row of memory cells 94 is connected to a word line 102, and each column of memory cells 94 is connected to a bit line 104 generally as a grid. The term access lines may refer to word lines 102, bit lines 104, or combinations thereof. Word lines 102 and bit lines 104 may be perpendicular (or nearly so) to one another and may create an array of memory cells 94. As shown in FIG. 1, the two memory cells 94 in a memory cell stack 100 may share a common conductive line such as a bit line 104. That is, a bit line 104 may be coupled with the bottom electrode of the upper memory cell 94 and the top electrode of the lower memory cell 94. Other configurations may be possible, for example, a third deck may share a word line 102 with a lower deck. In general, one memory cell 94 may be located at the intersection of two conductive lines such as a word line 102 and a bit line 104. This intersection may be referred to as a memory cell's address. A target memory cell 94 may be a memory cell 94 located at the intersection of an energized word line 102 and bit line 104; that is, word line 102 and bit line 104 may be energized to read or write a memory cell 94 at their intersection. Other memory cells 94 that are coupled with (e.g., connected to) the same word line 102 or bit line 104 may be referred to as untargeted memory cells 94.

Electrodes may be coupled with a memory cell 94 and a word line 102 or a bit line 104. The term electrode may refer to an electrical conductor, and in some cases, may be employed as an electrical contact to a memory cell 94. An electrode may include a trace, wire, conductive line, conductive material, or the like that provides a conductive path between elements or components of memory device 90. In some examples, a memory cell 94 may include a chalcogenide material positioned between a first electrode and a second electrode. One side of the first electrode may be coupled to a word line 102 and the other side of the first electrode to the chalcogenide material. In addition, one side of the second electrode may be coupled to a bit line 104 and the other side of the second electrode to the chalcogenide material. The first electrode and the second electrode may be the same material (e.g., carbon) or different.

Operations such as reading and writing may be performed on memory cells 94 by activating or selecting a word line 102 and bit line 104. In some examples, the bit lines 104 may also be referred to as digit lines. References to access lines, word lines, and bit lines, or their analogues, are interchangeable without loss of understanding or operation. Activating or selecting a word line 102 or a bit line 104 may include applying a voltage to the respective line. Word lines 102 and bit lines 104 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 94 may be controlled through a row decoder 106 and a column decoder 108. For example, a row decoder 106 may receive a row address from the memory controller 110 and activate the appropriate word line 102 based on the received row address. Similarly, a column decoder 108 may receive a column address from the memory controller 110 and activate the appropriate bit line 104. For example, memory array 92 may include multiple word lines 102, labeled WL_1 through WL_M, and multiple bit lines 104, labeled BL_1 through BL_N, where M and N depend on the array size. Thus, by activating a word line 102 and a bit line 104, e.g., WL_2 and BL_3, the memory cell 94 at their intersection may be accessed. As discussed below in more detail, accessing memory cells 94 may be controlled through a row decoder 106 and a column decoder 108 that may include one or more doped materials that extend in a direction away from a surface of a substrate coupled to the memory array 92.

Upon accessing, a memory cell 94 may be read, or sensed, by sense component 112 to determine the stored state of the memory cell 94. For example, a voltage may be applied to a memory cell 94 (using the corresponding word line 102 and bit line 104) and the presence of a resulting current may depend on the applied voltage and the threshold voltage of the memory cell 94. In some cases, more than one voltage may be applied. Additionally, if an applied voltage does not result in current flow, other voltages may be applied until a current is detected by sense component 112. By assessing the voltage that resulted in current flow, the stored logic state of the memory cell 94 may be determined. In some cases, the voltage may be ramped up in magnitude until a current flow is detected. In other cases, predetermined voltages may be applied sequentially until a current is detected. Likewise, a current may be applied to a memory cell 94 and the magnitude of the voltage to create the current may depend on the electrical resistance or the threshold voltage of the memory cell 94. In some examples, a memory cell 94 may be programmed by providing an electric pulse to the cell, which may include a memory storage element. The pulse may be provided via word line 102, bit line 104, or a combination thereof.

The sense component 112 may include various transistors or amplifiers to detect and amplify a difference in the signals. The detected logic state of memory cell 94 may then be output through column decoder 108 via input/output 114. In some cases, the sense component 112 may be part of a column decoder 108 or row decoder 106. Alternatively, the sense component 112 may be connected to or coupled with column decoder 108 or row decoder 106. The sense component may be associated either with the column decoder or the row decoder.

A memory cell 94 may be set or written by activating the relevant word line 102 and bit line 104 and at least one logic value may be stored in the memory cell 94. Column decoder 108 or row decoder 106 may accept data, for example input/output 114, to be written to the memory cells 94. In the case of a memory cell including a chalcogenide material, a memory cell 94 may be written to store a logic state in the memory cell 94 by applying the first voltage to the memory cell 94 as part of the access operation based on coupling the first conductive line of the decoder (e.g., row decoder 106 or column decoder 108) with the access line (e.g., word line 102 or bit line 104).

In some cases, the memory device 90 may be in an IDLE phase; an IDLE phase may be a configuration with low power consumption, for example. In some examples the memory device 90 may be in an ACTIVE phase; an ACTIVE phase may be a configuration in which the memory device is immediately ready to execute received commands, for example. In some examples, the memory device may be in a PULSE phase; a PULSE phase may be a configuration during which a command is executed, for example, e.g., a target memory cell is accessed and biased to program or to read a logic state into or from the memory cell.

Based on the phase of the memory device 90 (e.g., IDLE phase, ACTIVE phase or PULSE phase, among others), the memory controller 110 may control the operation and voltages (e.g., read, write, re-write, refresh, discharge, shield, float) of memory cells 94 through the various components, for example, row decoder 106, column decoder 108, and sense component 112. In some cases, one or more of the row decoder 106, column decoder 108, and sense component 112 may be co-located with the memory controller 110.

The memory controller 110 may generate row and column address signals to activate the desired word line 102 and bit line 104. The memory controller 110 may also generate and control various other voltages or currents used during the operation of memory device 90. For example, the memory controller 110 may bias to a shielding voltage (e.g., a ground voltage) access lines adjacent to the target access line and/or access lines in a same group as the addressed access line. The memory controller 110 may also float other access lines unrelated to the addressed access line.

The memory controller 110 may be configured to select the memory cell 94 by applying a first voltage to the first conductive line of the decoder (e.g., row decoder 106 or column decoder 108). In some cases, the memory controller 110 may be configured to couple the first conductive line of the decoder with an access line (e.g., word line 102 or bit line 104) associated with the memory cell 94 based on selecting the memory cell 94. The memory controller 110 may be configured to apply the first voltage to the memory cell 94 based at least in part on coupling the first conductive line of the decoder with the access line.

In some examples, the memory controller 110 may be configured to apply a second voltage to a second conductive line of the decoder as part of the access operation. Applying the first voltage to the memory cell 94 may be based on applying the second voltage to the second conductive line. For example, the memory controller 110 may select the memory cell 94 based on an intersection of the first voltage and the second voltage. In some cases, a signal applied to the memory cell 94 as part of the access operation may have a positive polarity or a negative polarity.

In some examples, the memory controller 110 may receive a command comprising an instruction to perform the access operation on the memory cell 94 and identify an address of the memory cell 94 based on receiving the command. In some cases, applying the second voltage to the second conductive line may be based on identifying the address. If the access operation is a read operation, the memory controller 110 may be configured to output a logic state stored in the memory cell 94 based on applying the first voltage to the memory cell 94. If the access operation is a write operation, the memory controller 110 may store a logic state in the memory cell 94 based on applying the first voltage to the memory cell 94.

In some examples, the memory controller 110 may modify a state of the memory device 90 based on receiving the command. For example, the memory controller 110 may implement a transition from an IDLE phase to an ACTIVE phase based on receiving an access command. For example, the memory controller 110 may implement a transition from an ACTIVE phase to a PULSE phase based on receiving an access command. For example, the memory controller 110 may implement a transition from a PULSE phase back to an ACTIVE phase based on completion of a PULSE phase command. For example, the memory controller 110 may implement a transition from an ACTIVE phase back to an IDLE phase based on an access counter or a time counter meet respective threshold, as it will be described in detail below. For example, the memory controller 110 may keep memory device 90 in an ACTIVE phase if the access counter and the time counter are below respective threshold.

Figure 2:
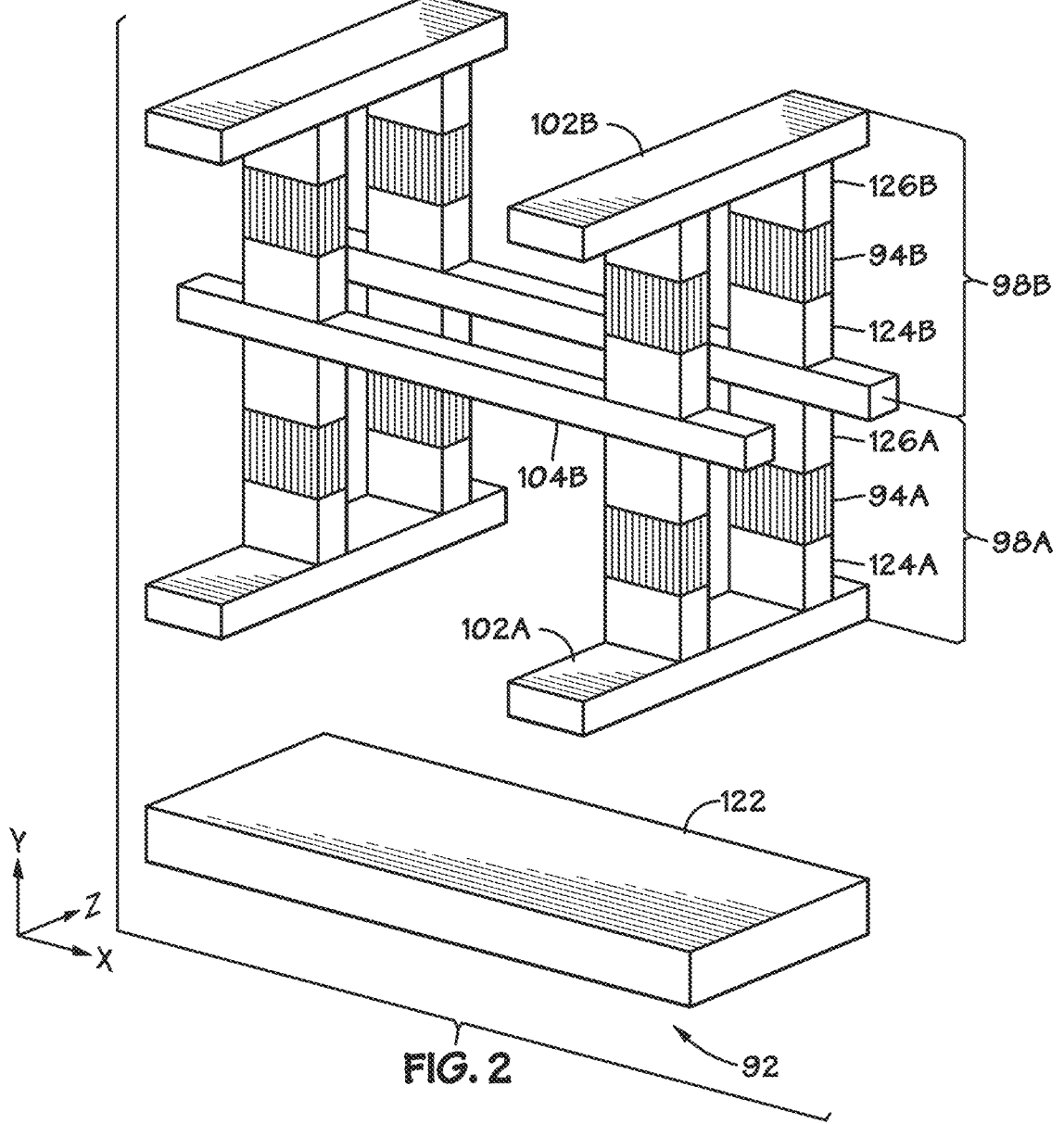
FIG. 2 is an orthogonal-view of a diagram illustrating the portion of the memory array of FIG. 2, according to an embodiment of the present disclosure.
Figure 5:
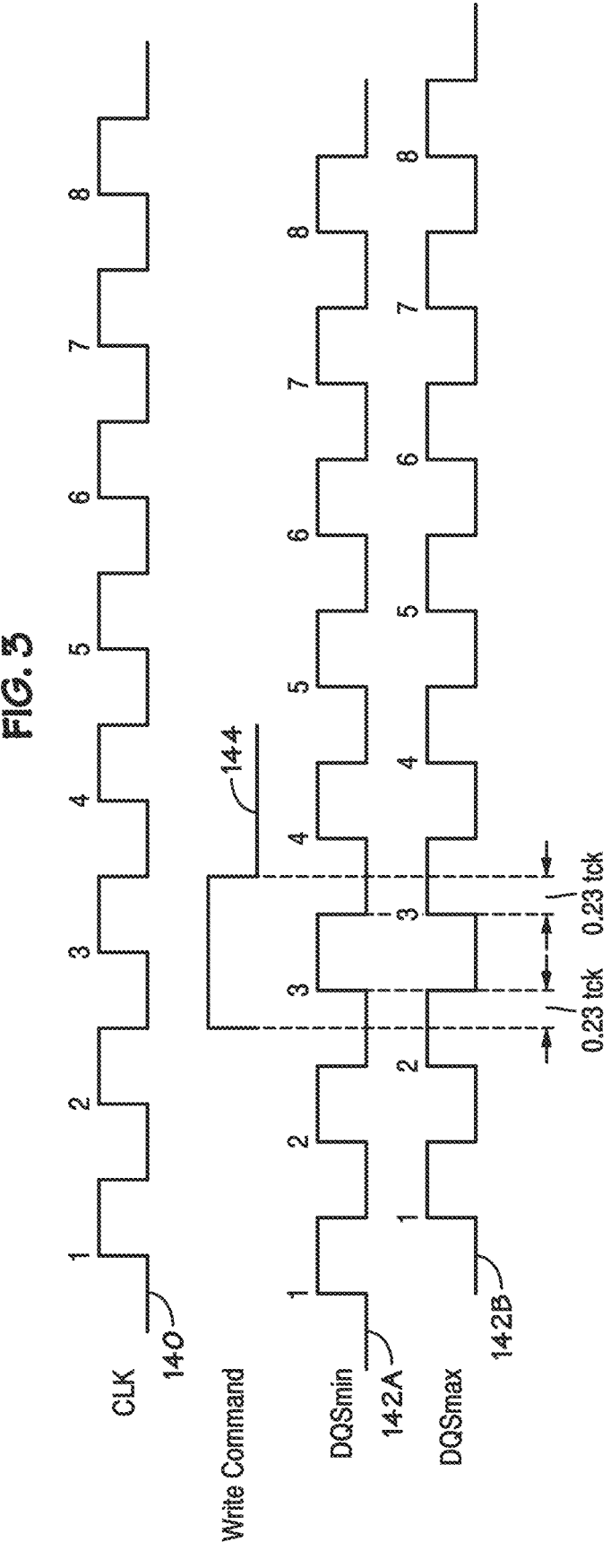

FIG. 2 illustrates a perspective view of an exemplary 3D memory array supporting single transistor drivers in accordance with embodiments of the present disclosure. Memory array 92 may be an example of portions of memory array 92 described with reference to FIG. 1. Memory array 92 may include a first array or deck 98A of memory cells that is positioned above a substrate 122 and second array or deck 98B of memory cells on top of the first array or deck 98A. Memory array 92 may also include word line 102A and word line 102B, and bit line 104A, which may be examples of word line 102 and bit line 104, as described with reference to FIG. 1. Memory cells of the first deck 98A and the second deck 98B each may have one or more memory cells (e.g., memory cell 94A and memory cell 94B, respectively). Although some elements included in FIG. 2 are labeled with a numeric indicator, other corresponding elements are not labeled, though they are the same or would be understood to be similar, in an effort to increase visibility and clarity of the depicted features.

Memory cells 94 of the first deck 98A may include first electrode 124A, memory cell 94A (e.g., including chalcogenide material), and second electrode 126A. In addition, memory cells of the second deck 98B may include a first electrode 124B, memory cell 94B (e.g., including chalcogenide material), and second electrode 126B. The memory cells of the first deck 98A and second deck 98B may, in some examples, have common conductive lines such that corresponding memory cells of each deck 98A and 98B may share bit lines 104 or word lines 102 as described with reference to FIG. 1. For example, first electrode 124B of the second deck 98B and the second electrode 126A of the first deck 98A may be coupled to bit line 104A such that bit line 104A is shared by vertically adjacent memory cells 94. In accordance with the teachings herein, a decoder may be positioned above or below each deck if the memory array 92 includes more than one deck. For example, a decoder may be positioned above first deck 98A and above second deck 98B. In some cases, the memory cells 94 may be examples of phase-change memory cells or self-selecting memory cells.

The architecture of memory array 92 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of memory cells may be constructed above a substrate 122, which may be referred to as a two-dimensional memory. In some examples, a three or four memory decks of memory cells may be configured in a similar manner in a three-dimensional cross point architecture.

In some examples, one or more of the memory decks may include a memory cell 94 that includes chalcogenide material. The memory cell 94 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, a memory cell 94 including chalcogenide material may be programmed to a logic state by applying a first voltage. By way of example and without being bound by a particular theory, when a particular memory cell 94 is programed, elements within the cell separate, causing ion migration. Ions may migrate towards a particular electrode, depending on the polarity of the voltage applied to the memory cell. For example, in a memory cell 94, ions may migrate towards the negative electrode. The memory cell 94 may then be read by applying a voltage across the cell to sense. The threshold voltage seen during a read operation may be based on the distribution of ions in the memory cell 94 and the polarity of the read pulse.

In some cases, a first voltage may be applied to a first conductive line of a decoder as part of an access operation of the memory cell 94. Upon applying the first voltage, the first conductive line may be coupled with the access line (e.g., word line 102A, word line 102B, or bit line 104A) associated with the memory cell 94. In some examples, a shielding voltage may be applied to a second conductive line of the decoder and the second conductive line may be coupled to an access line adjacent to the addressed access line or to an access line grouped with the addressed access line. In some examples, a floating voltage may be applied to access lines that are neither adjacent to nor grouped with the addressed access line (e.g., other access lines in the same deck as the addressed access line—not shown in FIG. 2).

Keeping the forgoing in mind, the memory controller 110 may use a clock signal when selecting a memory cell 94 to access. As described above, there may be a two or more clock domains within the memory device, such as a clock domain used by a computing device communicatively coupled to the memory controller 110 and a clock domain used by the memory controller 110, the sense component 112, the memory array 92, or the like (e.g., by components of the memory device 90). These clock domains may be relatively unaligned from each other, such that an access command received from the computing device may be clocked at an unsuitable time, and obtaining the timing alignment based on comparing signals receiving at input/output circuitry may be challenging due to a relatively large proximity between said inputs in 3D memory arrays 92. To improve at least this operation, an access command may be transmitted through delay locked loop (DLL) circuitry to align timing of the access command with timing of the memory device 90. When these timings are aligned, the access command may clock a suitable portion of data for reading from or writing to the memory device 90 without relying on retiming of the access command based on a determination of timing misalignment between its timing and timing of data to be clocked (e.g., timing of a data clock (DQS) signal).

To elaborate, FIG. 3 illustrates an example timing diagram comparing timing of a system clock (CLK) signal 140 (e.g., timing of X) to two data strobe or data clock (DQS) signals 142, where DQS signal 142A represents a first timing alignment (e.g., timing of −1.27*X) and wherein DQS signal 142B represents a second timing alignment (e.g., timing of +1.27*X), in accordance with embodiments of the present disclosure. In a given memory device 90, there may be a threshold amount of timing variation in DQS signals permitted for the memory device 90, such as a threshold amount defined by a design specification and/or by a user. In this example, the threshold amount of timing variation in the DQS signals 142 is +/−0.27 the timing of the CLK signal 140 (e.g., +/−0.27tck). The threshold amount of timing variation is used to define how early the DQS signals 142 may be timed relative to the CLK signal 140 and still be in compliance with operational standards for the memory device 90. It is noted that any suitable threshold amount of timing variation may be used for a memory device 90, such as +/−0.50tclk, +/−0.04tclk, or the like.

Given the variability of the DQS signal 142, access commands, such as a write command signal 144, may be relatively difficult to align to the transition of the DQS signal 142 without having specific information regarding the timing of the DQS signal 142 at a time of clocking (or time used for clocking). The timing of the DQS signal 142 may be obtained based on signals received at an input pad, such as an input pad of the input/output 114, however the amount of time used to transmit the timing to the computing device that generates the access commands may render the timing obtained outdated. For example, the input pad that receives the CLK signal 140 may be disposed relatively far from the input pad that receives the DQS signal 142, and thus may be difficult to use to retime the write command signal 144.

Another aspect to consider when considering use of timing alignment with operation of a memory array 92 is how timing of the write command signal 144 is to align with timing of the DQS signal 142 to enable latching of data of the write command signal 144. The write command signal 144 may be created off of the falling edge of the CLK signal 140. To latch the write command signal 144 at a mid-point of command transmission, 0.5tclk set up time may be used and a 0.5tclk hold time may be used for the DQS signal 142 to latch values of the write command signal 144. However, since by specification, the DQS signal 142 may vary +/−0.27tclk relative to the CLK signal 140, 0.23tclk of setup and hold time may be relied on. With ideal internal timing, 0.23tclk setup and hold times may be attainable. However, due to silicon variances and temperature changes, some margin is lost to variable material performances. Thus, obtaining the 0.23tclk setup and hold times may be difficult. However, sending the write command signal 144 through a DLL circuit may enable maintenance of the desired 0.23tclk setup and hold times. It is noted that 0.23tclk setup and hold times are referred to herein as a specified example, however these values may be adjusted for different devices, and any suitable value may be used.

Figure 4:
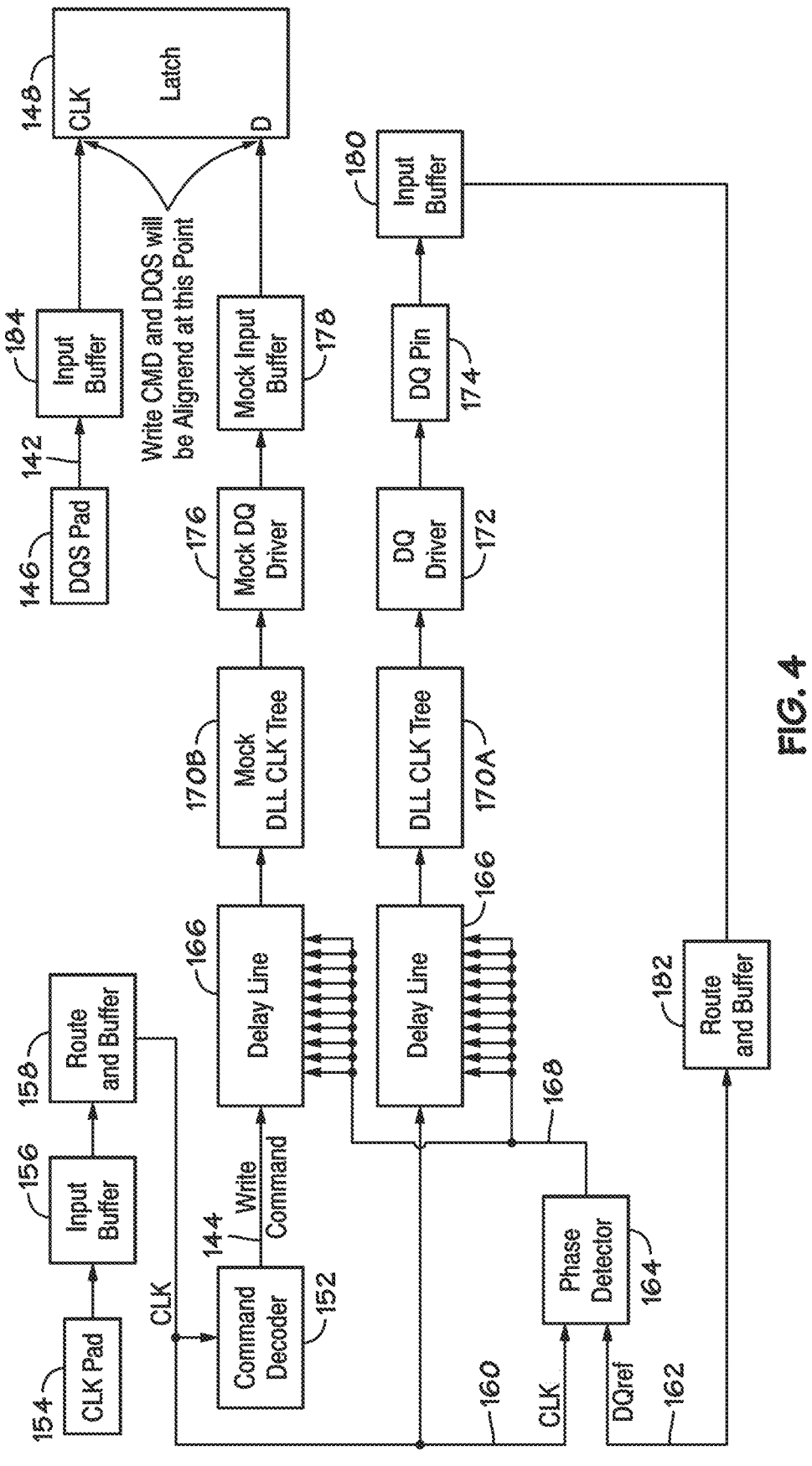
FIG. 4 is a block diagram illustrating delay locked loop (DLL) circuitry of the memory device of FIG. 1 configurable to delay an access command (e.g., a write command) by a substantially similar amount as a reference clock (CLKref) signal when generating a clocking signal associated with one or more data (DQ) pins, according to an embodiment of the present disclosure.

FIG. 4 illustrates a block diagram of mock DLL circuitry that receives a write command signal 144 (or another access command) and delays the write command signal 144 a same, or substantially similar, amount as a clock transmitted through DLL circuitry, in accordance with embodiments of the present disclosure. The write command signal 144 may be received by a command decoder block 152 and clocked in by a clock received at a clock input pad 154 (e.g., CLK pad). Input buffer circuitry, such as input buffer 156 and route and buffer circuitry 158 may be included to match delays or to better align the write command signal 144 with a reference clock (CLKref) signal 160 (e.g., clock reference signal). Generally, the write command signal 144 is transmitted in parallel with the CLKref signal 160, such that both undergo similar amounts of degradation and delay before being output from the DLL circuitry and/or before being latched via latch 148 (e.g., latch circuit). Indeed, when aligned, a falling edge of the CLKref signal 160 may align with a first rising edge write command signal 144. Furthermore, when aligned, a duration of time (between a respective rising edge and a subsequent falling edge) of a DQS signal 142 received at data clock (DQS) pad 146 may align with a 0.5tclk period of the write command signal 144 (e.g., a centered time duration relative to a total duration of time used to transmit the write command signal 144), as generally illustrated in FIG. 3. Alignment in this way may reduce a likelihood that the DQS signal 142 causes latching of data of the access command (e.g., the write command signal 144) too early or too late, thereby generally improving quality of memory operations prior to the access command arriving at the latch 148.

The DLL circuitry receives the CLKref signal 160 and may align the CLKref signal 160 to a phase detected of the data reference (DQref) signal 162 using phase detector circuitry 164. To do so, the phase detector circuitry 164 may detect a phase difference and/or a timing difference between the CLKref signal 160 and the DQref signal 162. The phase detector circuitry 164 may use any suitable technique to detect a phase of a data signal being transmitted at a data pin (DQ pin) to/from the memory array 92. For example, the phase detector circuitry 164 may manage an indication of a count to determine durations of time between rising edges of the DQref signal 162 that correspond to a phase of the DQref signal 162.

Delay line circuitry 166 may receive control signals 168 from the phase detector circuitry 164. The delay line circuitry 166 may respectively delay the write command signal 144 and the CLKref signal 160 by a same amount in response to (and based on) the control signals 168, such as to correct or reduce the phase difference and/or timing differences. Once delayed, the CLKref signal 160 and the write command signal 144 (now respectively characterized with a phase shift or a delay relative to an original timing of the signal) may be transmitted to DLL clock trees 170 (e.g., DLL clock tree 170A, DLL clock tree 170B). The DLL clock tree 170A may distribute the CLKref signal 160 to one or more data drivers 172 (DQ driver), and thus one or more data (DQ) pins 174 and input buffers 180. As such, the DLL clock tree 170A may include multiple transmission paths having same or similar circuitry (e.g., logic gates, latching circuitry, etc.) to transport a signal from the delay line circuitry 166 to each of the data drivers 172 in parallel.

The DLL clock tree 170B (e.g., mock DLL clock tree) may include circuitry matching one of the transmission paths of the DLL clock tree 170A, thereby causing the write command signal 144 transmitted via the delay line circuitry 166 to arrive at a same time to a mock data driver 176 as the CLKref signal 160 arrives at the one or more data drivers 172. The mock data driver 176 and a mock input buffer 178 may include components to match a delay applied to the CLKref signal 160 when transmitting to input buffer 180. For example, the mock data driver 176, the mock input buffer 178, and/or the DLL clock tree 170B may include sequentially coupled delay circuitry, inverter circuitry, flip-flops or the like to delay transmission of the write command signal 144 a suitable amount to match a delay of the CLKref signal 160. Indeed, the DLL clock tree 170B includes logic circuitry configured to delay the write command signal 144 (e.g., access command), already delayed by the first duration of time, by a second duration of time corresponding to delay applied by the DLL clock tree 170A to the CLKref signal 160 output from the delay line circuitry 166.

By aligning the write command signal 144 to the CLKref signal 160 and by subjecting both signals to the same delay (substantially similar delay, within a threshold amount of delay of each other), the transitions of the two signals may be aligned permitting latching of the suitable data values. The signals being in alignment may cause the write command signal 144 of FIG. 4 to align with the CLKref signal 160 of FIG. 4 similarly to the desired alignment shown between the CLK signal 140 of FIG. 4 and the write command signal 144 of FIG. 4. When the write command signal 144 timing matches or is substantially similar to the timing of the CLKref signal 160, desired setup and hold time may be achieved when the DQS signal 142 is operated within its operating ranges.

It is noted that DLL circuitry may include delay line circuitry 166 coupled to the DLL CLK tree 170A, the data driver 172, DQ pin 174, input buffer 180, route and buffer circuitry 182, and phase detector circuitry 164. Signals from the phase detector circuitry 164 may control delay line circuitry 166. The mock DLL circuitry included to delay the write command signal 144 may include delay line circuitry 166 coupled to the mock DLL CLK tree 170B, the mock data driver 176, and the mock input buffer 178. Delays applied to the signals via respective component may be thought of as delay durations. A delay associated with the input buffer (tIB), a delay associated with a route and buffer circuitry 182 (tR&B), a delay associated with the DLL clock tree 170A (tTree), and a delay associated with the DQ pin 174 (tDQ) may each be fixed for a given voltage and/or temperature combination. Thus, adjustments for differences between transmission paths of the CLKref signal 160 (e.g., through DLL circuitry) and the write command signal 144 (e.g., through mock DLL circuitry, additional delay circuitry or delay circuit branch) may be made via a delay associated with the delay line circuitry 166 (tDL). In this way, changes applied to the delay line circuitry 166 may compensate for differences in phases and/or frequencies between the CLKref signal 160 and the write command signal 144. It is further noted that input buffer circuitry, such as input buffer 180, mock input buffer 178, and input buffer 184 may be included to improve a quality of signal transmitted, such as by resetting voltages used to transmit a particular data value (e.g., logic high level of voltage, logic low level of voltage). Sometimes, the input buffer circuitry (e.g., input buffer 180, mock input buffer 178, input buffer 184) may be included to align delays between transmission paths, and thus may introduce non-equal amounts of delay. For example, the input buffer 180 may introduce more or less delay to the CLKref signal 160 than is introduced to the DQS signal 142 transmitted through the input buffer 184.

In some cases, a control lock may be used within the DLL circuitry. The control lock may prevent an access command (e.g., write command signal 144) from transmitting through the delay line circuitry 166 when the DLL circuitry is unlocked and/or the CLKref signal 160 is still being adjusted and locked on its target phase (e.g., a phase of the DQref signal 162). When the CLKref signal 160 is locked with the target phase (e.g., when the phase detector 164 detects a zero phase difference between the CLKref signal 160 and the DQref signal 162 or a difference in phases less than or equal to a threshold amount of difference), the control signals 168 from the phase detector circuitry 164 may be permitted to transmit to both portions of the delay line circuitry 166, and thus may be permitted to delay (e.g., adjust) the write command signal 144.

It is noted that specific references are made herein to "rising" and "falling" edges of signals. For ease of description, these references were made consistently relative to one another. However, it should be understood that the opposite may apply based on specific logic circuitry used within the memory device 10. Indeed, rising edges may correspond to falling edges of the disclosure in an actual implementation.

Systems and methods described herein may be applied to read commands, as well as write commands (as described herein). To align a read command with a center of a DQS signal 142, similar transmission through DLL circuitry may occur but a different latching circuitry may be used than latch 148. Latch 148 may clock data of the write command into the memory array 92. A latch used with the read command may clock data from the memory array 92 for association with the read command or for incorporation into the read command. However, these operations may similarly benefit from alignment performed via DLL circuitry.

Technical effects of the present disclosure include systems and methods that enable memory systems to align an access command with a timing of a reference clock used to clock data signals to or from a memory array. A delay locked loop (DLL) circuit may be used to align the access command, for example a write command, with the reference clock by subjecting the access command to circuitry to mimic or replicate delays applied to the reference clock when transmitted through a delay line, a clock tree, and eventually to an input buffer for use. Other systems of the computing device may benefit from use of the DLL circuit to delay a signal to a same amount as a reference clock signal. Computing device operation may improve when the access command is aligned with the reference clock signal since data associated with the access command may be latched at a suitable time without further concern for timing delays between the signals (e.g., latched at 0.5tclk).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a controller configured to access memory based on a command and a clock signal; and
command delay circuitry configured to delay the command based on a phase difference between a data signal from a data (DQ) pin and the clock signal.

2. The device of claim 1, wherein the controller comprises a memory controller.

3. The device of claim 1, wherein the command comprises a memory write command.

4. The device of claim 3, comprising additional delay circuitry to delay a read command.

5. The device of claim 3, wherein the command delay circuitry comprising a plurality of delay circuitry configured to align the memory write command and data before being latched.

6. The device of claim 1, comprising a plurality of data buffers configured to compensate delays between transmission paths.

7. The device of claim 1, wherein the controller is configured to operate the command delay circuitry to compensate time domain differences.

8. A device, comprising:
a media controller configured to access memory media based on generating a command; and
a subsystem operable to add latency to the command and communicatively coupled to the media controller, the subsystem comprising:
a first input operable to receive a clock signal;
a second input operable to receive the command; and
command delay circuitry configured to delay the clock signal and the command based on a phase of a data signal from a data (DQ) pin.

9. The device of claim 8, wherein the subsystem comprises additional command delay circuitry configured to align between at least two respective transmission paths.

10. The device of claim 8, wherein the subsystem is configured to:
receive, via the second input, the command;
receive, via the first input, the clock signal;
align, via locking circuitry of the command delay circuitry, the clock signal to the data signal; and
providing, from the locking circuitry in response to aligning the clock signal to the data signal, at least one signal to first delay circuitry of the command delay circuitry configured to delay the command based on the at least one signal.

11. The device of claim 8, wherein the data signal indicates a delay to compensate timing latency from a perspective of an input/output of a memory controller.

12. A method of operating a subsystem of a memory media, comprising:
receiving, via a first input, an access command;
receiving, via a second input, a clock signal;
aligning, via locking circuitry; the clock signal to a phase of a data signal from a data (DQ) pin;
providing, from the locking circuitry based on aligning the clock signal to the data signal, at least one signal to first delay circuitry; and
delaying the access command via the first delay circuitry being programmed based on the at least one signal.

13. The method of claim 12, comprising aligning the clock signal to the data signal based on the locking circuitry locking the clock signal to the data signal.

14. The method of claim 12, comprising further delaying the access command via second delay circuitry configured to align between a plurality of transmission paths associated with the access command.

15. The method of claim 12, wherein delaying the access command comprises transmitting the access command through second delay circuitry after the first delay circuitry.

16. The device of claim 1, wherein the memory comprises a plurality of memory banks.

17. The device of claim 1, wherein a dual in-line memory module (DIMM) comprises the controller and the command delay circuitry.

18. The device of claim 1, comprising input/output circuitry and decoder circuitry.

19. The device of claim 18, wherein the controller is coupled between the input/output circuitry and the decoder circuitry.

20. The device of claim 1, comprising:
first input circuitry configured to receive the clock signal; and
second input circuitry configured to receive the data signal.

\* \* \* \* \*